US008258019B2

(12) United States Patent  
Mong et al.

(10) Patent No.: US 8,258,019 B2
(45) Date of Patent: Sep. 4, 2012

(54) FLIP CHIP ASSEMBLY PROCESS FOR ULTRA THIN SUBSTRATE AND PACKAGE ON PACKAGE ASSEMBLY

(75) Inventors: Weng Khoon Mong, Penang (MY); A. Vethanayagam Rudge, Penang (MY); Bok Sim Lim, Penang (MY); Mun Leong Loke, Penang (MY); Kang Eu Ong, Penang (MY); Sih Fei Lim, Penang (MY); Tean Wee Ong, Penang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/164,404

(22) Filed: Jun. 30, 2008

(65) Prior Publication Data

US 2009/0321928 A1 Dec. 31, 2009

(51) Int. Cl.
*H01L 21/00* (2006.01)
(52) U.S. Cl. ........ 438/127; 438/612; 257/667; 257/668; 257/690; 257/701; 257/738
(58) Field of Classification Search .............. 438/127, 438/612; 257/667, 668, 690, 701, 738
See application file for complete search history.

(56) References Cited

U.S. PATENT DOCUMENTS

| | | | |
|---|---|---|---|
| 6,169,022 B1 * | 1/2001 | Saitou | 438/613 |
| 6,404,062 B1 * | 6/2002 | Taniguchi et al. | 257/778 |
| 6,650,022 B1 | 11/2003 | Danvir et al. | |
| 6,713,366 B2 | 3/2004 | Mong et al. | |
| 7,005,317 B2 | 2/2006 | Chin et al. | |
| 7,071,576 B2 * | 7/2006 | Nakayoshi et al. | 257/788 |
| 7,172,951 B2 | 2/2007 | Chin et al. | |
| 2002/0024137 A1 * | 2/2002 | Olofsson et al. | 257/738 |
| 2002/0068453 A1 * | 6/2002 | Grigg et al. | 438/690 |
| 2003/0011077 A1 * | 1/2003 | Morishima et al. | 257/778 |
| 2009/0321949 A1 * | 12/2009 | Sim et al. | 257/777 |

FOREIGN PATENT DOCUMENTS

| | | |
|---|---|---|
| CN | 1956183 A | 5/2007 |
| JP | 00-357714 A | 12/2000 |
| KR | 02-0001426 | 1/2002 |
| WO | 2010/002739 A2 | 1/2010 |
| WO | 2010/002739 A3 | 2/2010 |

OTHER PUBLICATIONS

United States Patent Application, pending—not yet published, Application No. TBD, filed Jun. 30, 2008, to Huay Huay Sim.
International Search Report for corresponding matter P27076PCT, mailed Feb. 4, 2010.
International Preliminary Report on Patentability received for PCT Patent Application No. PCT/US2009/048921, mailed on Jan. 31, 2011, 6 pages.
Office Action received for Chinese Patent Application No. 200980110789.3, mailed on Aug. 8, 2011, 13 pages of Chinese Office Action including 6 pages of English Translation.

* cited by examiner

*Primary Examiner* — Jarrett Stark
*Assistant Examiner* — Nicholas Tobergte
(74) *Attorney, Agent, or Firm* — Schwegman, Lundberg & Woessner, P.A.

(57) ABSTRACT

In some embodiments, selective electroless plating for electronic substrates is presented. In this regard, a method is introduced including receiving a coreless substrate strip, attaching solder balls to a backside of the coreless substrate strip, and forming a backside stiffening mold amongst the solder balls. Other embodiments are also disclosed and claimed.

9 Claims, 2 Drawing Sheets

… (US 8,258,019 B2)

FLIP CHIP ASSEMBLY PROCESS FOR ULTRA THIN SUBSTRATE AND PACKAGE ON PACKAGE ASSEMBLY

FIELD OF THE INVENTION

Embodiments of the present invention generally relate to the field of integrated circuit packages, and, more particularly to flip chip assembly process for ultra thin substrate and package on package assembly.

BACKGROUND OF THE INVENTION

As microelectronic components shrink in size, a trend has emerged to provide package substrates that may be characterized as thin core substrates (that is, substrates having a core with a thickness less than or equal to 400 microns and larger than zero), or no-core substrates (that is, substrates without cores).

Disadvantageously, with a thin or no-core substrate, however, decrease in yield at first level chip attach due to warpage causing nonwets may occur during the package manufacturing process, such as, for example, during flip chip bonding where substrate flatness and rigidity are required. To address the above issue, the prior art sometimes provides substrates that may have a thickness of at least several tens of microns or more. However, the above measure disadvantageously detracts from further package size minimization.

BRIEF DESCRIPTION OF THE DRAWINGS

The present invention is illustrated by way of example and not limitation in the figures of the accompanying drawings in which like references indicate similar elements, and in which.

DETAILED DESCRIPTION

In the following description, for purposes of explanation, numerous specific details are set forth in order to provide a thorough understanding of the invention. It will be apparent, however, to one skilled in the art that embodiments of the invention can be practiced without these specific details. In other instances, structures and devices are shown in block diagram form in order to avoid obscuring the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
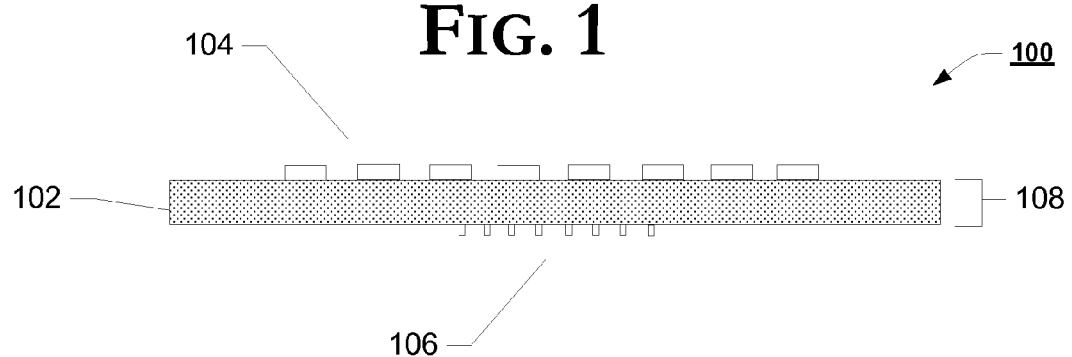
FIG. 1 is a graphical illustration of a cross-sectional view of a partially formed IC package, in accordance with one example embodiment of the invention.

FIG. 1 is a graphical illustration of a cross-sectional view of a partially formed IC package, in accordance with one example embodiment of the invention. In accordance with the illustrated example embodiment, package 100 includes one or more of coreless substrate strip 102, backside contacts 104, topside contacts 106 and substrate thickness 108.

Coreless substrate strip 102 represents a thin substrate that may be rolled out and processed before being singulated. In one embodiment, coreless substrate strip 102 is a direct laser lamination generation 3 (DLL3) strip. In one embodiment, substrate thickness 108 is about 200 micrometers.

Figure 2:
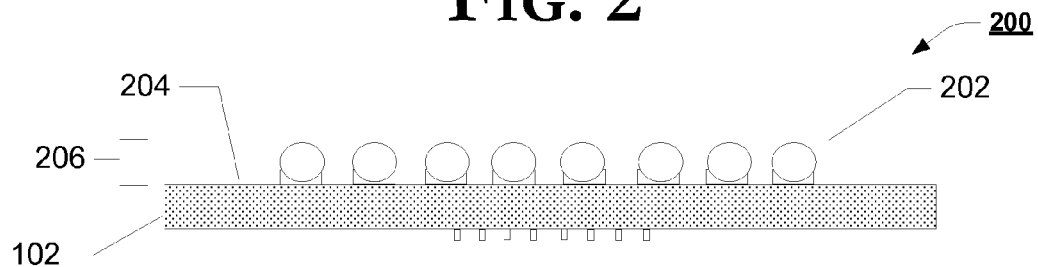
FIG. 2 is a graphical illustration of a cross-sectional view of a partially formed IC package, in accordance with one example embodiment of the invention.

FIG. 2 is a graphical illustration of a cross-sectional view of a partially formed IC package, in accordance with one example embodiment of the invention. As shown in package 200, solder balls 202 have been attached to backside 204 of coreless substrate strip 102. In one embodiment, solder ball diameter 206 is about 10 mils.

Figure 3:
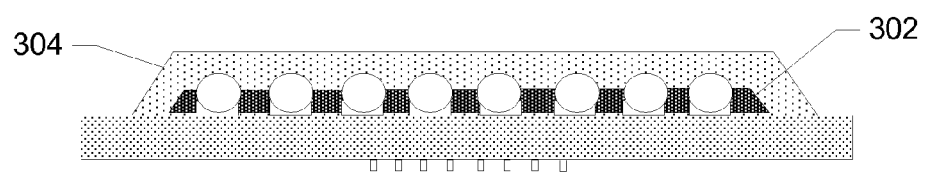
FIG. 3 is a graphical illustration of a cross-sectional view of a partially formed IC package, in accordance with one example embodiment of the invention.

FIG. 3 is a graphical illustration of a cross-sectional view of a partially formed IC package, in accordance with one example embodiment of the invention. As shown in package 300, mold compound 302 is dispensed as a liquid amongst the solder balls and compressed by mold form 304. In one embodiment, mold form 304 is designed to compress mold compound 302 below the height of the solder balls. Mold form 304 may be held in place for some time and may be heated to allow mold compound 302 to cure.

Figure 4:
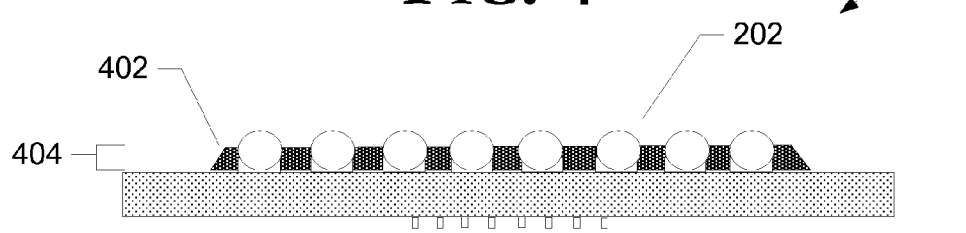
FIG. 4 is a graphical illustration of a cross-sectional view of a partially formed IC package, in accordance with one example embodiment of the invention.

FIG. 4 is a graphical illustration of a cross-sectional view of a partially formed IC package, in accordance with one example embodiment of the invention. As shown in package 400, stiffening mold 402 is cured amongst solder balls 202 and provides added stiffness to package 400. In one embodiment, stiffening mold 402 has a mold thickness 404 of about 200 micrometers.

Figure 5:
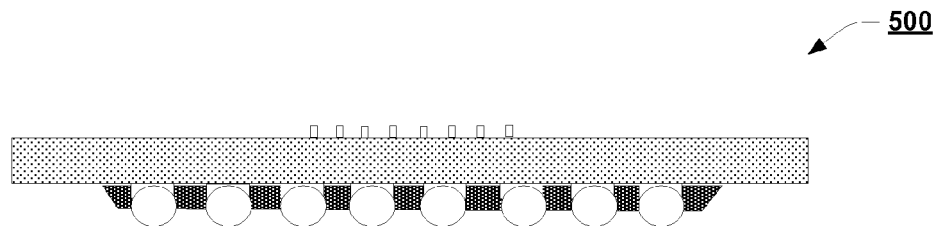
FIG. 5 is a graphical illustration of a cross-sectional view of a partially formed IC package, in accordance with one example embodiment of the invention.

FIG. 5 is a graphical illustration of a cross-sectional view of a partially formed IC package, in accordance with one example embodiment of the invention. As shown in package 500, the package has been flipped over for topside processing.

Figure 6:
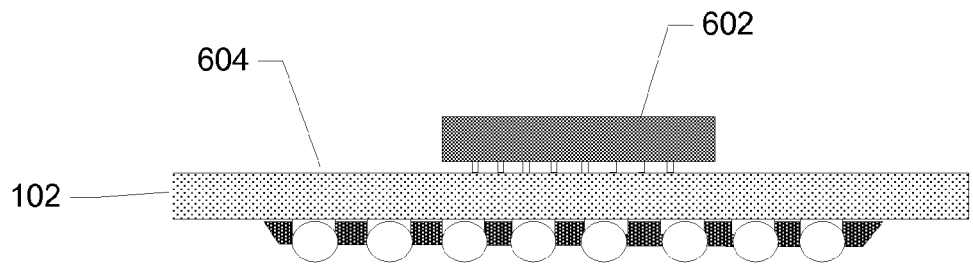
FIG. 6 is a graphical illustration of a cross-sectional view of a partially formed IC package, in accordance with one example embodiment of the invention.

FIG. 6 is a graphical illustration of a cross-sectional view of a partially formed IC package, in accordance with one example embodiment of the invention. As shown in package 600, integrated circuit device 602 has been attached to topside 604 of coreless substrate strip 102. Integrated circuit device 602 may represent any type of silicon processor or controller or logic.

Figure 7:
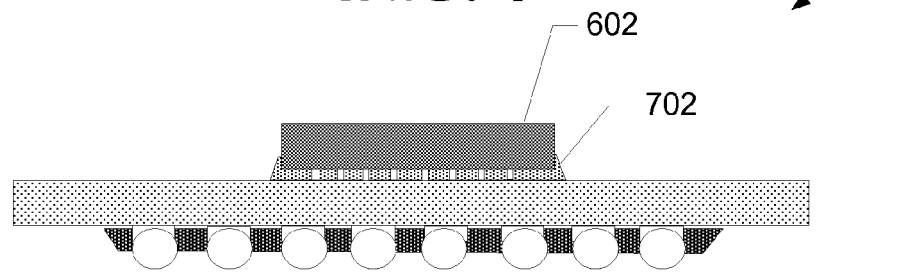
FIG. 7 is a graphical illustration of a cross-sectional view of a partially formed IC package, in accordance with one example embodiment of the invention.

FIG. 7 is a graphical illustration of a cross-sectional view of a partially formed IC package, in accordance with one example embodiment of the invention. As shown in package 700, underfill material 702 has been dispensed under integrated circuit device 602.

Figure 8:
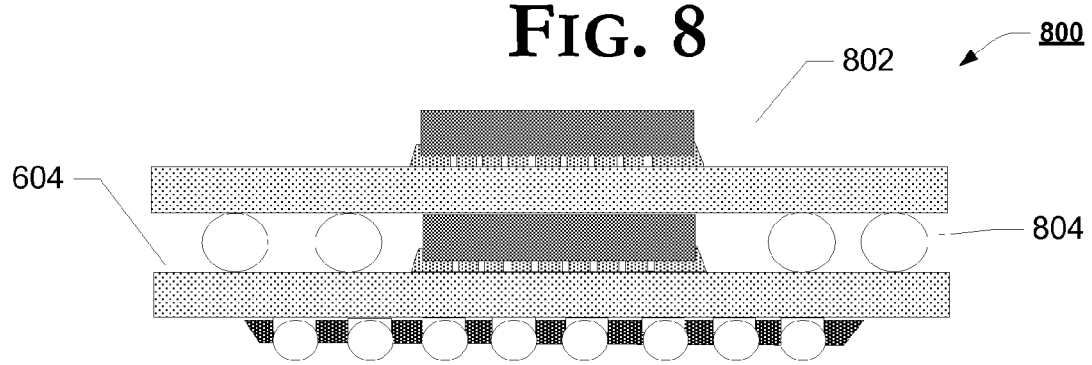
FIG. 8 is a graphical illustration of a cross-sectional view of a partially formed IC package, in accordance with one example embodiment of the invention.

FIG. 8 is a graphical illustration of a cross-sectional view of a partially formed IC package, in accordance with one example embodiment of the invention. As shown in package 800, second integrated circuit device package 802 has been attached to topside 604 through solder balls 804. Second integrated circuit device package 802 may be any type of package and need not be a flip chip package.

In one embodiment, package 800 is processed further and singulated from other packages.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

Many of the methods are described in their most basic form but operations can be added to or deleted from any of the methods and information can be added or subtracted from any of the described messages without departing from the basic scope of the present invention. Any number of variations of the inventive concept is anticipated within the scope and spirit of the present invention. In this regard, the particular illustrated example embodiments are not provided to limit the invention but merely to illustrate it. Thus, the scope of the present invention is not to be determined by the specific examples provided above but only by the plain language of the following claims.

What is claimed is:

1. A method comprising:
   receiving a coreless substrate strip;
   attaching solder balls to a backside of the coreless substrate strip;
   dispensing a liquid mold compound amongst the solder balls;
   compressing the liquid mold compound below a height of the solder balls with a mold form; and
   heating the mold form to cure the liquid mold compound.

2. The method of claim 1, wherein the coreless substrate strip comprises a direct laser lamination strip.

3. The method of claim 1, further comprising attaching an integrated circuit device to a topside of the coreless substrate strip.

4. The method of claim 3, further comprising attaching an integrated circuit device package to the topside of the coreless substrate strip.

5. A method comprising:
   receiving a direct laser lamination substrate strip;
   attaching solder balls to a backside of the substrate strip;
   dispensing a liquid mold compound amongst the solder balls;
   compressing the liquid mold compound below a height of the solder balls with a mold form; and
   heating the mold form to cure the liquid mold compound.

6. The method of claim 5, wherein the substrate strip comprises a thickness of about 200 micrometers.

7. The method of claim 5 wherein the backside stiffening mold comprises a thickness of about 200 micrometers.

8. The method of claim 5, further comprising attaching an integrated circuit device to a topside of the coreless substrate strip.

9. The method of claim 8, further comprising attaching an integrated circuit device package to the topside of the coreless substrate strip.

* * * * *